United States Patent
Nilsson

(10) Patent No.: US 7,952,340 B2
(45) Date of Patent: May 31, 2011

(54) INTEGRATED POWER CONVERTER AND GATE DRIVER CIRCUIT

(75) Inventor: Joakim Nilsson, Mölndal (SE)

(73) Assignee: SAAB AB, Linköping (SE)

( * ) Notice: Subject to any disclaimer, the term of this patent is extended or adjusted under 35 U.S.C. 154(b) by 419 days.

(21) Appl. No.: 12/155,534

(22) Filed: Jun. 5, 2008

(65) Prior Publication Data

US 2008/0310189 A1 Dec. 18, 2008

(30) Foreign Application Priority Data

Jun. 5, 2007 (EP) .................................... 07446006

(51) Int. Cl.
*G05F 1/46* (2006.01)
*G05F 1/56* (2006.01)

(52) U.S. Cl. ........................ 323/289; 327/404

(58) Field of Classification Search ................ 323/223, 323/225, 265, 271, 282, 289; 327/108, 404, 327/427, 430, 434

See application file for complete search history.

(56) References Cited

U.S. PATENT DOCUMENTS

| | | | |
|---|---|---|---|
| 4,912,622 A * | 3/1990 | Steigerwald et al. | 363/98 |
| 5,546,043 A * | 8/1996 | Pollmeier | 327/427 |
| 5,933,034 A * | 8/1999 | Hastings et al. | 327/108 |
| 6,166,921 A | 12/2000 | Rudelle et al. | |
| 6,570,413 B1 * | 5/2003 | Kumagai et al. | 327/108 |
| 7,330,017 B2 * | 2/2008 | Dwarakanath et al. | 323/282 |
| 2005/0242795 A1 | 11/2005 | Al-Kuran et al. | |

OTHER PUBLICATIONS

A. Consoli et al.; A Comparative Study of Different Buck Topologies for high Efficiency Low Voltage Applications; IEEE; 1999, pp. 60-65.

Slavko Djukie et al.; A Planar 4.5-GHz DC-DC Power Converter; IEEE Transactions on Microwave Theory and Techniques, vol. 47, No. 8, Aug. 1999; pp. 1457-1460.

European Patent Office Examination Report, dated May 10, 2010, issued in connection with counterpart application No. EPO 07 446006.4-2207.

European Patent Office Search Repot, dated Oct. 25, 2007, issued in connection with counterpart application No. EPO 07446006.4-2207.

* cited by examiner

*Primary Examiner* — Gary L Laxton

(74) *Attorney, Agent, or Firm* — Venable LLP; Eric J. Franklin

(57) ABSTRACT

A gate driver circuit arranged to supply a DC/DC converter with a switching voltage. Both the gate driver circuit and the DC/DC converter include at least one transistor and at least one further component. The DC/DC converter is arranged to convert an input voltage to an output voltage and to supply to a load. A power converter includes the gate driver circuit and the DC/DC converter. The gate driver circuit can be designed such that the transistors are in the form of transistors being suitable for being manufactured in an MMIC-process or an RFIC-process.

15 Claims, 2 Drawing Sheets

INTEGRATED POWER CONVERTER AND GATE DRIVER CIRCUIT

CROSS-REFERENCE TO RELATED APPLICATIONS

This application claims priority to European patent application 07446006.4 filed 5 Jun. 2007.

TECHNICAL FIELD

The present invention relates to the field of gate drivers for operating transistor switches in DC/DC converters and in particular to the field of integrating DC/DC converters and gate drivers in Microwave Monolithic Integrated Circuit (MMIC) or Radio Frequency Integrated Circuit (RFIC) technology.

BACKGROUND ART

DC/DC converters are commonly used in electronics today for changing the voltage or the polarity of the feeding electric power. The simplest converter is a linear converter comprising one or several resistors in series with the DC source, dividing the voltage over the resistors. A common type of switched DC/DC converters applies a DC voltage across an inductor with a certain frequency. Typical frequencies are around 100-500 kHz. When the voltage is applied over the inductor, current flows through the inductor and electromagnetic energy is stored in the inductor. When the voltage across the inductor is cut off, the energy stored in the inductor will flow through the load connected to the output of the DC/DC converter. Ideally the input voltage to the DC/DC converter $V_{in}$ relates to the output voltage of the converter $V_{out}$ as the total cycle time T relates to the time voltage is applied across the inductor $t_{on}$, i.e.

$$\frac{V_{in}}{V_{out}} = \frac{T}{t_{on}}$$

By varying the on/off time of voltage over the inductor the output voltage of the DC/DC converter can be varied. This relation is valid for so called step down converters where the output voltage is decreased in relation to the input voltage.

There are also DC/DC converters available that can increase the output voltage in relation to the input voltage or that can change the polarity. Some examples of converter types are Buck, Boost, Buck-boost, Flyback, Push-pull and Sepic. They are all based on the principle of storing energy over an inductor during a first cycle and then releasing the energy during a second cycle. A transistor is used for switching the current flow to the inductor on and off. To do this work the transistor needs a switching voltage applied to its base or gate terminal. This switching voltage is supplied by a gate driver circuit as will be explained below.

FIG. 1a shows a prior art DC/DC converter 100 with two transistors T1 and T2, 101 and 102, connected in series between a ground 103 and a voltage input 104 of the DC/DC converter with a potential $V_{in}$. Each transistor has three terminals, gate, source and drain. The gate terminals 105 and 106 of the transistors are connected to a first connection point 107. The source terminal 108 of the transistor T2, 102, is connected to the ground 103. The drain terminal 109 of the transistor T2 is connected to the source terminal 111 of the transistor T1, 101, via a first connection line 110 and the drain terminal 112 of the transistor T1 is connected to the input voltage $V_{in}$ at the voltage input 104. A first diode 113 is connected between the ground and a second connection point 118. The second connection point 118 is connected to the drain terminal 109 of the transistor T2 via a second connection line 119. Forward direction of the diode is from the ground to the second connection point 118. A first inductor is 114 is connected between the second connection point 118 and a third connection point 115. Finally a first capacitor 116 and a first load 117 are connected in parallel between the ground and the third connection point 115. An output voltage $V_{out}$ is thus supplied across the load 117. The transistor T1 is of type P-channel enhancement mode and the transistor T2 of a type called N-channel depletion mode. The characteristics of these transistor types are shown in the diagram of FIG. 1b with gate voltage $V_g$ on a horizontal axis 123 and drain current $I_d$ on a vertical axis 124. The drain current through the transistor T1 is shown with a curve 121 and the corresponding current through the transistor T2 is shown with a curve 122. As can be seen the current through the transistor T1 increases with decreased gate voltage while current through the transistor T2 increases with increased gate voltage. These transistors are therefore called complementary transistors. The gate voltage $V_g$ at which the drain current $I_d$ is zero is called the pinch-off voltage. The first connection point 107 is fed by a square wave pulse varying between 0V and a negative voltage supplied by a pulse generator 130 via a first resistor 131 being an inner resistance of the pulse generator 130. At negative input voltage the transistor T2 will be switched off and the transistor T1 will be switched on, current will in this first phase flow through the transistor T1, the second connection point 118 will assume a potential close to $V_{in}$ and causing current to flow through the first inductor 114 and the first load 117. At 0V input voltage the transistor T1 will be switched off and the transistor T2 will be switched on causing the second connection point 118 to assume a value close to ground potential. In this second phase electromagnetic energy stored in the first inductor during the first phase will cause current to flow through the first load and the first diode. This second phase is also called the freewheel phase.

Another prior art solution for a DC/DC converter 200 is shown in FIG. 2 using a transformer, making it possible to use only one transistor. The transformer 201 has a primary winding 202 and a secondary winding 203. The primary winding is fed by a square wave pulse varying between 0V and a negative voltage supplied by a pulse generator 204 via a second resistor 205 being the inner resistance of the pulse generator 204. The secondary winding 203 having two ends, the first end is connected to a source terminal 206 and the second end to a gate terminal 207 of a transistor T3, 208. Drain terminal 209 of the transistor T3 is connected to an input voltage $V_{in}$ at a point 210. A second diode 211 is connected between a ground 214 and the source terminal 206 with forward direction from the ground 214 to the source terminal 206. A second inductor 212 is connected between the source terminal 206 and a fourth connection point 213. Finally a second capacitor 215 and a second load 216 are connected in parallel between the ground 214 and the fourth connection point 213. The transistor T3 is of P-channel enhancement type or N-channel depletion type. The varying gate voltage will cause the transistor T3 to be switched on and off which means that the source terminal will assume a positive voltage $V_{in}$ and a negative voltage. When the transistor T3 is switched on current will flow through the second inductor 212 and the second load 216. When the transistor T3 is switched off electromagnetic energy stored in the second inductor 212 during the phase when the transistor is switched on will cause current to flow through the second load and the second diode. This is also called the freewheel phase.

In both prior art solutions described above the switch transistors T1, T2 and T3 in the DC/DC converters are switched on and off by a switching voltage provided by a pulse generator including also a transformer in the example of FIG. 2. Henceforth in the description a gate driver is defined as a circuit providing a switching voltage to the DC/DC converter causing the switching transistor or transistors in the DC/DC converter to be switched on and off. In the example of FIG. 1 the gate driver comprises the pulse generator and in the example of FIG. 2 the gate driver comprises the pulse generator and the transformer.

In many applications today there is a need for DC/DC converters having high switching frequencies at high voltages and being able to supply high power with good thermal efficiency. The Monolithic Microwave Integrated Circuit (MMIC) technology is well suited to meet these requirements. However also RFIC (Radio Frequency Integrated Circuit) can be used even if this process can not be used at as high frequencies as MMIC. In many applications where an RF-amplifier is made in an MMIC chip or RFIC chip it would be desirable to integrate also a DC/DC converter and gate driver in the same chip.

However gate drivers of today are made of discrete components and DC/DC converters are often based on using complementary transistors and/or transformers not allowing integration in MMIC or RFIC. These solutions are also space consuming and relatively slow.

US 2005/0242795 A1 discloses an MMIC DC/DC converter fabricated in GaAs technology. A drawback with this solution is that it does not allow a high power output.

Thus there is a need for an improved alternative solution for a compact and fast gate driver circuit and DC/DC converter possible to integrate in MMIC or RFIC and allowing at the same time a high output power from the DC/DC converter where the transistors are realized in an MMIC or an RFIC manufacturing process. There is also a need for a power converter comprising the gate driver circuit and the DC/DC converter.

SUMMARY

The object of the invention is to remove at least some of the above mentioned deficiencies with prior art solutions and to provide a gate driver circuit to solve the problem of providing an improved alternative solution for a compact and fast gate driver circuit and DC/DC converter possible to integrate in MMIC or RFIC and at the same time allow a high output power from the DC/DC converter where the transistors are realized in an MMIC or an RFIC manufacturing process.

The object is achieved by providing a gate driver circuit, the gate driver circuit being suitable for, and arranged to supply a DC/DC converter with a switching voltage. The gate driver circuit comprises at least one transistor and at least one further component wherein the design of the gate driver circuit comprises three transistors T4, T5 and T6 each comprising a source terminal, a gate terminal and a drain terminal and designed such that the transistors T4 and T5 are arranged in parallel, the drain terminal of T4 is connected to the gate terminal of T6 and the source terminal of T6 is connected to the drain terminal of T5 via at least one further component and the source terminals of T4 and T5 are connected.

A further advantage of the invention is that it provides a power converter wherein the power converter comprises the gate driver circuit for a gate driver circuit and the DC/DC converter. The gate driver circuit is arranged to supply the DC/DC converter with a switching voltage.

An advantage of the invention is that it can be implemented using RFIC or MMIC and at the same time provide a high output power from the DC/DC converter. The invention will henceforth mainly be described with reference to MMIC. The MMIC can be used at higher frequencies than the RFIC.

The further component can be any type of electronic component, active or passive, as will be described in the detailed description.

The DC/DC converter can be of any type such as Buck, Boost, Buck-boost, Flyback, Push-pull and Sepic as long as they do not include components not possible to include in MMIC, like e.g. transformers.

An advantage with the invention is that it allows for integration of a power converter providing a high output power from the DC/DC converter and comprising the gate driver circuit and the DC/DC converter in one and the same MMIC chip thus making the design very compact. A further advantage is the good thermal efficiency that can be obtained.

Additionally the invention also has the advantage of allowing integration of a gate driver circuit in an MMIC chip.

A further advantage with using MMIC technology used in some embodiments of the invention is that some of the MMIC processes allow using high voltages and high power with good thermal efficiency. In a typical application, using a SiC in the MMIC process, $V_{in}$ can be 60V and $V_{out}$ 40V. However other values of $V_{in}$ and $V_{out}$ can be used within the scope of the invention.

Further advantages can be achieved by implementing one or several of the features of the dependent claims, over and above those mentioned above.

DETAILED DESCRIPTION

The invention will now be described in detail with reference to the drawings and some examples on how to implement the invention.

Figure 1A:
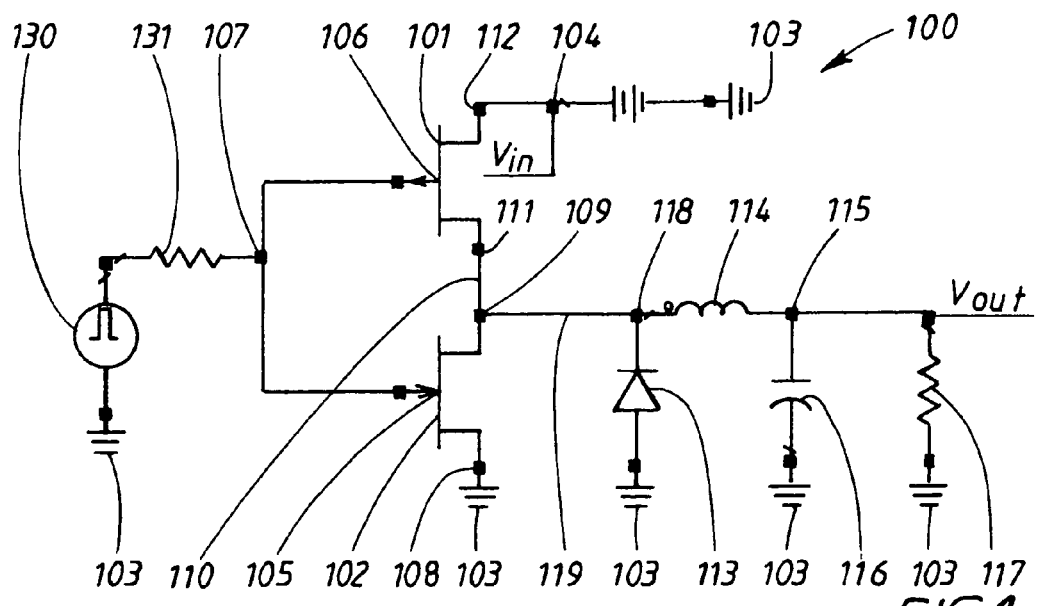
FIG. 1a schematically shows a prior art DC/DC converter.
Figure 1B:
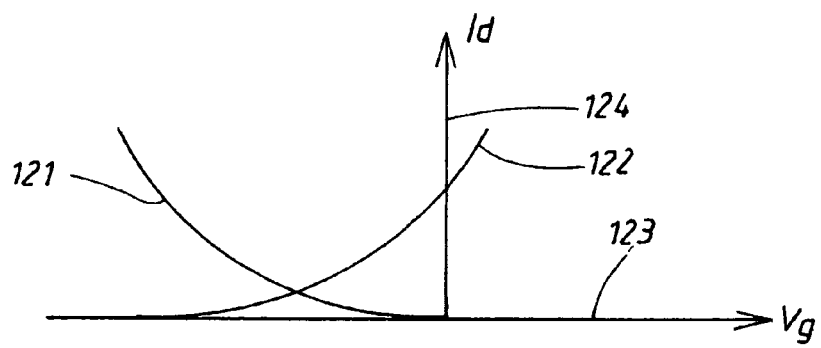
FIG. 1b shows a diagram of drain current as a function of gate voltage for complementary transistors.
Figure 2:
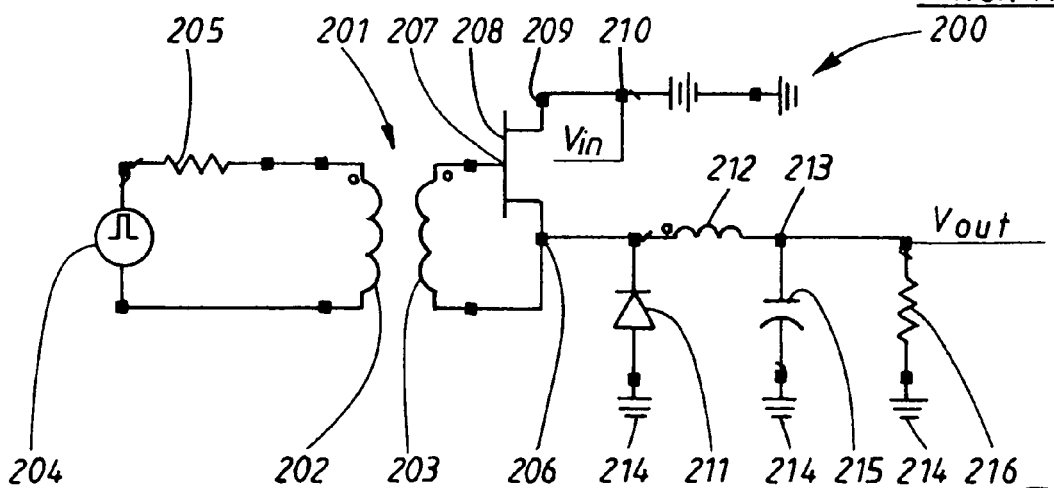
FIG. 2 schematically shows another prior art DC/DC converter based on the use of a transformer FIG. 3 schematically shows the gate driver circuit according to the invention.

FIG. 1-2 has been explained in association with Background art above.

Figure 3:
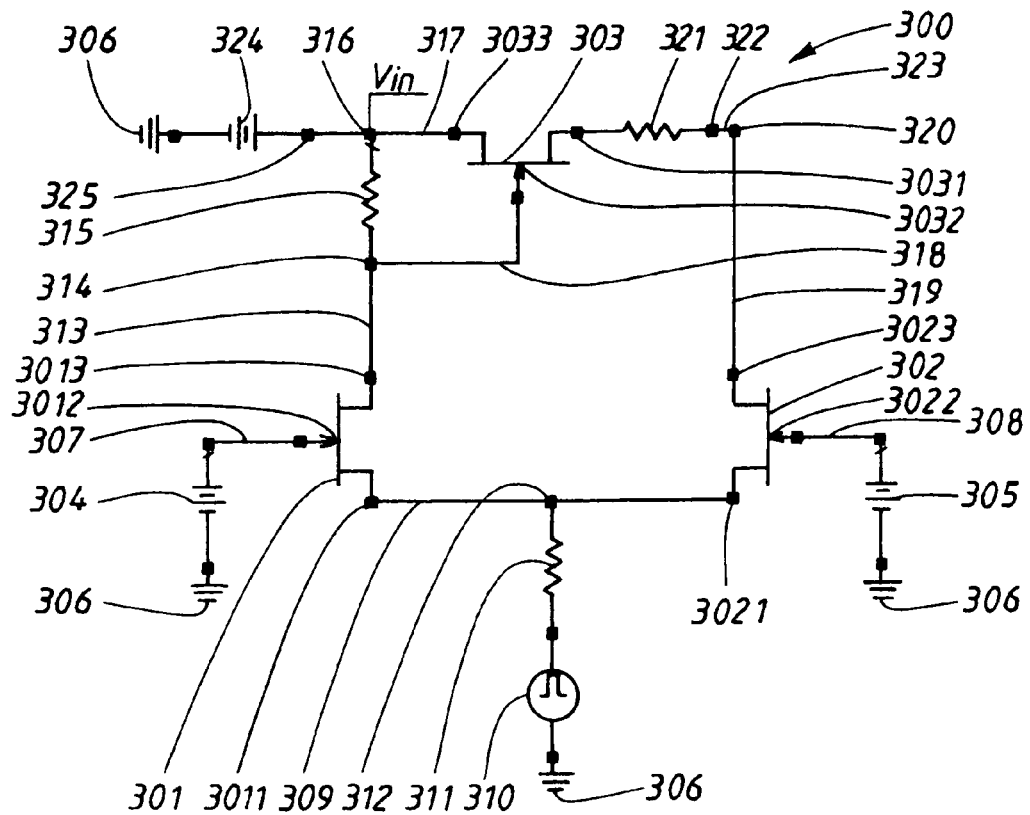

FIG. 3 schematically shows an embodiment of a gate driver circuit 300 according to the invention with batteries 304, 305, 324 and a pulse generator 310. The batteries and the pulse generator with its inner resistance being symbolized with a third resistor 311 are not part of the gate driver circuit but are only shown here for clarity reasons when explaining the function of the gate driver circuit. The gate driver circuit comprises three transistors T4-T6, 301-303. These transistors are of type N-channel depletion mode as these transistors have good RF properties. Preferably MESFET (Metal semiconductor Field Effect Transistor) transistors are used which is of N-channel depletion type but faster than silicon based JFET (Junction gate Field Effect Transistor) or MOSFET (Metal Oxide Semiconductor Field Effect Transistor). MESFET transistors are also manufactured according to the same process as MMIC. Each transistor has three terminals; source, gate and drain. The transistor T4, 301, has a source terminal 3011, a gate terminal 3012 and a drain terminal 3013. The transistors T5, 302, and T6, 303, have corresponding terminals. The general concept of the design of the gate driver circuit is that the transistors T4 and T5 are working in parallel, the drain terminal of T4 is connected to the gate terminal of T6 and the source terminal of T6 is connected to the drain terminal of T5 via a further component and the source terminals of T4 and T5 are connected.

MMIC has good RF properties and can be used in a frequency range up to 300 GHz. MMIC circuits are e.g. manufactured from Gallium Arsenide, Indium Phospfide, Silicon Germanium or Silicon carbide. DC/DC converters integrated in MMIC and made in this material allow very fast switching frequencies. MMIC can be manufactured using various types of technology, for example, MESFET process (Metal semiconductor Field Effect Transistor) or pHEMT (pseudomorphic High Electron Mobility Transistor). By using the MMIC technology it will be possible to use high switching frequencies, which leads to smaller DC/DC converters. One or several gate driver circuits, DC/DC-converters and other electronic circuits and/or components can be integrated in an MMIC chip. This is advantageous in applications where distributed power conversion is needed.

The embodiment of FIG. 3 will now be described more in detail. A negative voltage $-V_1$, being the so called pinch-off voltage for the transistor, in relation to a ground potential being zero Volt is applied to the gates 3012 and 3022 of the transistors T4 and T5 by means of the batteries 304 and 305 having a first terminal to a ground 306 and a second terminal connected to the gate terminals 3012 and 3022 through a third and fourth connection line 307 and 308. The source terminals 3011 and 3021 are connected together through a fifth connection line 309 and the pulse generator 310 having two terminals, one connected to the ground 306 and the other via the third resistor 311 to a fifth connection point 312 on the fifth connection line 309. The pulse generator switches between a maximum voltage $V_{max}$ and a minimum voltage $V_{min}$. The pulse generator is designed such that it delivers $V_{max}/V_{min}$ to the fifth connection point 312. In this example $V_{max}$ is 0 Volt and $V_{min}$ is $-V_2$ Volt. The value of $V_2$ is the same as the value of $V_1$ in this embodiment. The drain terminal 3013 of the transistor T4 is connected to the drain terminal 3033 of the transistor T6 via a sixth connection line 313, a fifth resistor 315 and a seventh connection line 317. The fifth resistor 315 having two ends, one end connected to the sixth connection line 313 at a sixth connection point 314 and the other end to the seventh connection line 317 at a seventh connection point 316. The drain terminal 3013 of the transistor T4 is also connected to the gate terminal 3032 of the transistor T6 via the sixth connection line 313, the sixth connection point 314 and an eighth connection line 318. The drain terminal 3023 of the transistor T5 is connected to an eighth connection point 320 via a ninth connection line 319. The source terminal 3031 of the transistor T6 is also connected to the eighth connection point 320 via a fourth resistor 321, a ninth connection point 322 and a tenth connection line 323. A fourth resistor 321, having two ends, is connected between the source terminal of the transistor T6 and the drain terminal of the transistor T5 via the ninth connection point 322, the tenth connection line 323, the eighth connection point 320 and the ninth connection line 319. Finally a battery 324 is connected between the ground 306 and an eleventh connection line 325 thus supplying a positive voltage $V_{in}$ via the eleventh connection line 325, the seventh connection point 316 and the seventh connection line 317 to the drain terminal 3033 of the transistor T6.

In the embodiment of FIG. 3 the further components comprises the fourth and fifth resistor 321 and 315.

The transistors T4-T6 are preferably of type N-channel depletion mode like e.g. MESFET transistors. Other types of MMIC-processes with N-channel type of transistors can also be used.

As stated earlier the purpose with the gate driver circuit is to supply a switching voltage to the DC/DC converter. In the embodiment of FIG. 3 with MESFET transistors this is accomplished as follows. The transistors T4 and T5 will be switched on when the pulse generator 310 supplies the source terminals 3011 and 3021 with the negative voltage $V_2$ through the third resistor 311 and the fifth connection line 309. This is due to the fact that there will be a potential of 0V between the gate terminal 3012 and the source terminal 3011 and between the gate terminal 3022 and the source terminal 3021 as the gate terminals are fed with $-V_1=-V_2$ in this embodiment As can be seen in FIG. 1b, curve 122, the transistors will be switched on and deliver a drain current at zero gate voltage. This will cause the eighth connection point 320 to assume a value of around $-V_2$ if the minor voltage drop across the transistor T5 is neglected. At the same time, when the transistor T4 is switched on, the pulse generator 310 will supply the gate terminal 3032 of the transistor T6 with the negative voltage $-V_2$ (neglecting voltage drop across the transistor T4). The value of the fourth resistor 321 will be chosen such that there will be a small current through transistor T6, i.e. the gate voltage of the transistor T6 will be close to the pinch-off voltage. A voltage drop $V_3$ over the fourth resistor 321 will cause the gate voltage of transistor T6 to come close to the pinch-off voltage. This effect can, in other embodiments, be accomplished with other further components. This means that the fourth resistor 321 can be replaced with one or several further components as long as this component or these components achieve the working point of the transistor to come close to the pinch-off voltage of the transistor T6.

When the pulse generator delivers 0V to the source terminal 3011 and 3021 via the third resistor 311, the fifth connection point 312 and the fifth connection line 309, the transistors T4 and T5 will be switched off as there now will be a negative potential of $-V_1$ between on the one hand the gate terminal 3012 and the source terminal 3011 and on the other hand between the gate terminal 3022 and the source terminal 3021. This means that the potential at the gate 3032 will increase from about $-V_2$ to about $V_{in}$ (minus a voltage drop over the fifth resistor 315 which will be minor as the current through the gate 3032 is very low). The transistor T6 will be fully switched on and deliver the potential $V_{in}$ to the eighth connection point 320, minus a voltage drop $V_4$ across the fourth resistor 321 and the transistor T6. The voltage drop $V_4$ will be minor when the transistor T6 is fully switched on and transistors T4 and T5 switched off as the eighth connection point 320 will be connected to a gate terminal of a transistor in the DC/DC converter (as will be explained in association with FIG. 4) which has a very high impedance. The gate driver circuit will thus deliver a switching voltage for the DC/DC converter at the eighth connection point 320 that will vary between $-V_2$ and $V_{in}$. Typical values for an application with the DC/DC converter supplying an RF amplifier, all integrated in MMIC using SiC, can be $V_{in}=60V$ and $V_2=-25V$. Other voltages, higher or lower, are also possible within the scope of the invention, $V_2$ can e.g. preferably be around $-5V$ to $-10V$ in other embodiments.

The gate driver circuit comprises transistors and further components. In the embodiment of FIG. 3 the further components comprises of two resistors, 315 and 321. The characteristics of the resistors are chosen such that suitable potentials and currents are obtained within the gate driver circuit. This desired function can also be realized by other combinations of further components. The further components can be any type of electronic components, active or passive, as long as the desired function is achieved. Each resistor can for example be replaced with a number of resistors connected in series, or each resistor can be connected in series with two opposite directed diodes in parallel. However any other way to realize the desired function using the further components is within the scope of the invention.

Figure 4:
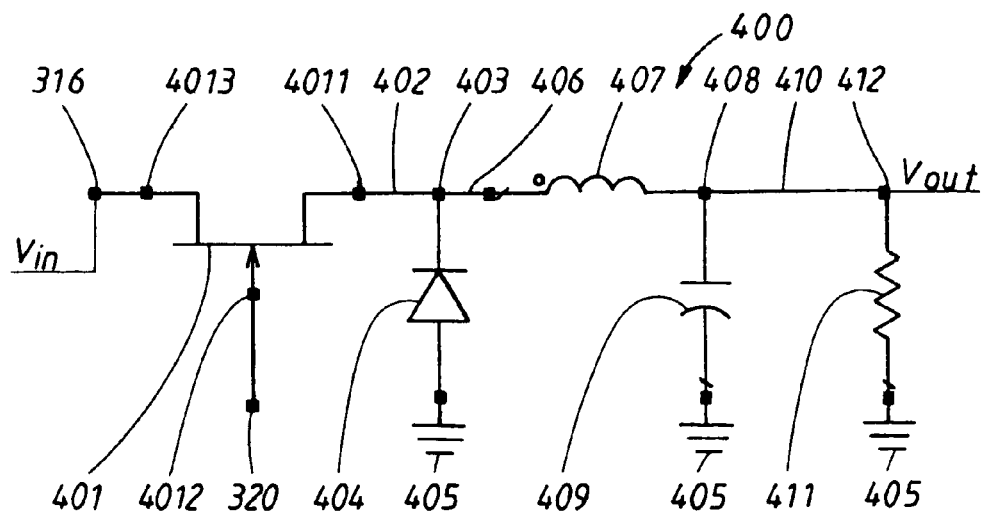
FIG. 4 schematically shows a DC/DC converter suitable for use with the gate driver circuit according to FIG. 3.

FIG. 4 schematically shows one embodiment of a DC/DC converter 400. The DC/DC-converter comprises a transistor T7, 401, having a source terminal 4011, a gate terminal 4012 and a drain terminal 4013. The transistor is of type N-channel depletion mode. The gate terminal 4012 is connected to the gate driver circuit in the eighth connection point 320 thus receiving the required switching voltage. The drain terminal 4013 is connected to the seventh connection point 316 thus being supplied with the input voltage $V_{in}$. The transistor T7, 401, is arranged to be switched on when the gate terminal 4012 is supplied with a voltage being substantially $V_{in}$ and to be switched off when the gate terminal 4012 is supplied with a voltage being substantially $V_{min}$. The source terminal 4011 is via a twelfth connection line 402 connected to a tenth connection point 403. A third diode 404 having two ends and being connected to ground at the first end and to a tenth connection point 403 at the second end, the tenth connection point 403 being connected to the source terminal 4011 of transistor 401, such that the forward direction of the third diode is from the ground 405 to the tenth connection point 403. A third inductor 407 having two ends and being connected to the tenth connection point 403 at the first end and to an eleventh connection point 408 at the second end, the eleventh connection point 408 being connected to the $V_{out}$ terminal 412 via a thirteenth connection line 410.

A third capacitor 409 having two ends and being connected to the $V_{out}$ terminal 412 via the thirteenth connection line (410) at the first end and to the ground 405 at the second end.

An output voltage $V_{out}$ is delivered to a $V_{out}$ terminal 412 via a thirteenth connection line 410. A third load 411 can then be connected between the $V_{out}$ terminal 412 and the ground 405.

In the embodiments shown in FIGS. 3 and 4 for a gate driver circuit and a DC/DC converter, the transistors have been realized with N-channel depletion mode type as e.g. MESFET. Other types of transistors can also be used as long as they can be realized in an MMIC or RFIC manufacturing process, i.e. the transistors in both the gate driver circuit and the DC/DC converter should be suitable for being manufactured in an MMIC or an RFIC process. The decisive factor according to the invention is that the transistors in the gate driver circuit and/or the DC/DC converter can be manufactured in an MMIC or RFIC manufacturing process and be integrated in an MMIC or an RFIC chip.

The gate driver circuit can thus be designed such that the transistors are in the form of transistors being suitable for being manufactured in an MMIC-process (Monolithic Microwave Integrated Circuit) or an RFIC-process (Radio Frequency Integrated Circuit) and such that the transistors in the gate driver circuit are integrated in an MMIC chip or an RFIC chip.

The DC/DC converter of FIG. 4 comprises one transistor. However other configurations for the DC/DC converter can be used incorporating e.g. several transistors. One such example is using two transistors in parallel with their respective terminals connected and feeding the switching voltage to the common gate terminal. This configuration is preferable when higher power shall be delivered to the load.

The embodiment of FIG. 4 comprises following components: an inductor, a diode and a capacitor. These components comprise a network of further components and the characteristics of these components are chosen such as to optimize a stable output voltage. This desired function can also be realized by other combinations of components. The components can be any type of electronic components, active or passive, as long as the desired function is achieved. At least one of the components in the network of further components of the DC/DC converter is integrated in the MMIC chip or the RFIC chip.

The invention also provides a power converter as mentioned above, the power converter comprises the gate driver circuit as described above and the DC/DC converter. The gate driver circuit is arranged to supply the DC/DC converter with a switching voltage.

Both the gate driver circuit and the DC/DC converter of the power converter comprises at least one transistor (301, 302, 303, 401) and at least one further component (315, 321, 404, 407, 409), the DC/DC converter being arranged to convert an input voltage $V_{in}$ to an output voltage $V_{out}$ and to supply $V_{out}$ to a third load (411), said transistors are in the form of transistors being suitable for being manufactured in an MMIC-process or an RFIC-process and designed such that the transistors (301, 302, 303, 401) are used both in the gate driver circuit and the DC/DC converter and that the transistors (301, 302, 303, 401) in the gate driver circuit and the DC/DC converter are integrated in an MMIC chip or RFIC chip.

The invention can typically be implemented with switching frequencies up to and above 1 GHz.

The invention is not limited to the embodiments above, but may vary freely within the scope of the appended claims. The description in relation to the figures only refer to MMIC but the same circuit design as shown in the figures is valid also for RFIC.

The invention claimed is:

1. A gate driver circuit, the gate driver circuit being suitable for, and arranged to supply a DC/DC converter with a switching voltage, the gate driver circuit comprising:
   at least three transistors; and
   at least one further component;
   wherein each of the at least three transistors comprises a source terminal, a gate terminal and a drain terminal and is designed such that the source terminal and the drain terminal of a first of the at least three transistors and a second of the at least three transistors are arranged in parallel, the drain terminal of the first transistor is connected to the gate terminal of a third of the at least three transistors and the source terminal of the third transistor is connected to the drain terminal of the second transistor via the at least one further component and the source terminals of the first transistor and the second transistor are connected.

2. The gate driver circuit according to claim 1, wherein the transistors are suitable for being manufactured in an MMIC-process or an RFIC-process and wherein the transistors in the gate driver circuit are integrated in an MMIC chip or an RFIC chip.

3. The gate driver circuit according to claim 1, wherein the transistors are of type N-channel depletion mode.

4. The gate driver circuit according to claim 1, wherein the transistors are Metal semiconductor Field Effect Transistors.

5. The gate driver circuit according to claim 1, wherein
   the source terminals of the first transistor and the second transistor are connected through a first connection line the source terminal of the third transistor, via the further component, and the drain terminal of the second transistor are connected to a first connection point the drain terminal of the first transistor is in galvanic contact with the gate terminal of the third transistor the drain terminal of the third transistor is arranged to be supplied with an input voltage and the source terminals of the first transistor and the second transistor are arranged to receive voltage pulses switching between a minimum value and a maximum value via the first connection line;

and wherein the first transistor, the second transistor and the third transistor are arranged such that:

when the gate terminals of the first transistor and the second transistor are arranged to be supplied with voltages such that the first transistor and the second transistor are switched on, substantially the minimum voltage is arranged to be supplied to the first connection point and when the gate terminals of the first transistor and the second transistor are arranged to be supplied with voltages such that the first transistor and the second transistor are switched off, substantially the input voltage is arranged to be supplied to the first connection point through the third transistor thus providing the switching voltage, varying between the minimum voltage and the input voltage, at the first connection point.

6. The gate driver circuit according to claim 1, wherein the at least one further component comprises an active or passive electronic component.

7. The gate driver circuit according to claim 6, wherein the at least one further component of the gate driver circuit comprises:

a first resistor having a first end and a second end and being in galvanic contact with the drain terminal of the first transistor at the first end and in galvanic contact with the drain terminal of the third transistor at the second end and a second resistor having a first end and a second end and being in galvanic contact with the source terminal of the third transistor at the first end and in galvanic contact with the first connection point at the second end.

8. The gate driver circuit according to claim 7, wherein the resistors are selected to control potentials and currents within the gate driver circuit.

9. The gate driver circuit according to claim 1, wherein the at least one further component is integrated in the MMIC chip or the RFIC chip.

10. A power converter, comprising:
a gate driver circuit comprising
at least three transistors; and
at least one further component,
wherein each of the at least three transistors comprises a source terminal, a gate terminal and a drain terminal and is designed such that the source terminal and the drain terminal of a first of the at least three transistors and a second of the at least three transistors are arranged in parallel, the drain terminal of the first transistor is connected to the gate terminal of a third of the at least three transistors and the source terminal of the third transistor is connected to the drain terminal of the second transistor via the at least one further component and the source terminals of the first transistor and the second transistor are connected; and a DC/DC converter, wherein the gate driver circuit is arranged to supply the DC/DC converter with a switching voltage.

11. A power converter according to claim 10, wherein both the gate driver circuit and the DC/DC converter comprise at least one transistor and at least one further component, the DC/DC converter being arranged to convert an input voltage to an output voltage and to supply the output voltage to a first load, said transistors are in the form of transistors being suitable for being manufactured in an MMIC-process or an RFIC-process and designed such that the transistors are used both in the gate driver circuit and the DC/DC converter and wherein the transistors in the gate driver circuit and the DC/DC converter are integrated in an MMIC chip or RFIC chip.

12. The power converter according to claim 11, wherein the DC/DC converter comprises:
at least one fourth transistor each comprising a source terminal, a gate terminal and a drain terminal
the at least one further component and wherein
the drain terminal of the at least one fourth transistor is arranged to be supplied with an input voltage at a second connection point
the gate terminal of the at least one fourth transistor is arranged to be connected to the switching voltage at the first connection point
the source terminal of the at least one fourth transistor is arranged to deliver the output voltage between a ground and an output voltage terminal via a network of further components
and wherein the at least one fourth transistor is arranged to be switched on when the gate terminal is supplied with a voltage being substantially the input voltage and to be arranged to be switched off when the gate terminal is supplied with a voltage being substantially the minimum voltage.

13. The power converter according to claim 12, wherein the network of further components of the DC/DC converter comprises:
a first diode having a first end and a second end and being connected to ground at the first end and to a third connection point at the second end, the third connection point being connected to the source terminal of the at least one fourth transistor, such that a forward direction of the first diode is from the ground to the third connection point,
a first inductor having a first end and a second end and being connected to the third connection point at the first end and to a fourth connection point at the second end, the fourth connection point being connected to the output voltage terminal via a second connection line and
a first capacitor having a first end and a second end and being connected to the output voltage terminal via the second connection line at the first end and to the ground at the second end.

14. The power converter according to claim 13, wherein the values of the components in the network of further components are chosen to optimize a stable output voltage.

15. The power converter according to claim 10, wherein at least one of the components in the network of further components of the DC/DC converter are integrated in the MMIC chip or the RFIC chip.

* * * * *